(12) United States Patent
Umehara et al.

(10) Patent No.: US 6,713,881 B2
(45) Date of Patent: Mar. 30, 2004

(54) SEMICONDUCTOR DEVICE AND METHOD OF MANUFACTURING SAME

(75) Inventors: Norito Umehara, Ibaraki (JP); Yoshikatsu Umeda, Beppu (JP)

(73) Assignee: Texas Instruments Incorporated, Dallas, TX (US)

( * ) Notice: Subject to any disclaimer, the term of this patent is extended or adjusted under 35 U.S.C. 154(b) by 60 days.

(21) Appl. No.: 09/866,244

(22) Filed: May 25, 2001

(65) Prior Publication Data

US 2002/0125584 A1 Sep. 12, 2002

(30) Foreign Application Priority Data

May 29, 2000 (JP) .......................................... 2000-157848

(51) Int. Cl.[7] .............................................. H01L 23/48
(52) U.S. Cl. .......................... 257/786; 257/784; 257/48; 257/780; 257/775; 257/773; 257/690; 257/692; 438/18; 438/106; 438/612; 438/756
(58) Field of Search .................................. 257/784, 786, 257/48, 580, 773, 775, 690, 692, 780, 738; 438/18, 106, 612, 756, 16, 17, 622, 13, 14, 15; 361/772

(56) References Cited

U.S. PATENT DOCUMENTS

| | | | | | |
|---|---|---|---|---|---|
| 5,506,499 A | * | 4/1996 | Puar | .................... | 324/158.1 |
| 5,554,940 A | * | 9/1996 | Hubacher | .................... | 324/765 |
| 5,783,868 A | * | 7/1998 | Galloway | .................... | 257/784 |
| 5,891,745 A | * | 4/1999 | Dunaway et al. | .............. | 438/18 |
| 5,923,047 A | * | 7/1999 | Chia et al. | ..................... | 257/48 |
| 6,068,892 A | * | 5/2000 | Ma | .............. | 428/14 |
| 6,091,155 A | * | 7/2000 | Jonaidi | ........................ | 257/786 |
| 6,291,899 B1 | * | 9/2001 | Wensel et al. | .............. | 257/787 |
| 6,313,541 B1 | * | 11/2001 | Chan et al. | ................... | 257/786 |
| 6,351,405 B1 | * | 2/2002 | Lee et al. | ....................... | 365/63 |
| 6,369,407 B1 | * | 4/2002 | Hikita et al. | ................... | 257/48 |
| 6,373,143 B1 | * | 4/2002 | Bell | ............................. | 257/786 |
| 6,429,675 B2 | * | 8/2002 | Bell | ............................. | 324/675 |

* cited by examiner

Primary Examiner—Nathan J. Flynn
Assistant Examiner—Fazli Erdem
(74) Attorney, Agent, or Firm—Frederick J. Telecky, Jr.; W. James Brady III

(57) ABSTRACT

Object: To provide sufficient connection strength between the bonding pads and conductor wires in a wire bonding method.

Means for Solution: The bonding pads 20 upon a semiconductor chip 18 are provided with a bonding region 30 and a probe contact region 32, and one end of the conductor wire 22 is bonded to the bonding region 30. The probe contact to the probe contact region 32 is used for making contact to the tips of the test probes in the semiconductor chip inspection step performed prior to the bonding.

20 Claims, 5 Drawing Sheets

SEMICONDUCTOR DEVICE AND METHOD OF MANUFACTURING SAME

FIELD OF THE INVENTION

The present invention relates to a conductor wire bonding structure and method in semiconductor devices, and particularly to a semiconductor device with increased wire connection strength with respect to the pads, and a method of manufacturing same.

BACKGROUND OF THE INVENTION

In semiconductor devices, the wire bonding method is well known as a method of connecting a mounted semiconductor chip to the external connection terminals of the package. In the wire bonding method, the bonding pads and inner leads of a semiconductor chip and wiring upon an insulating substrate on which a semiconductor chip is mounted (these are referred to together as "lands") are connected with fine metal wire of gold or the like. The tip of a metal wire extending from the tip of a tool called a capillary is heated to form a ball which is compression bonded to the bonding pad of the semiconductor chip, and the conductor wire is quickly extruded to form a loop whose tip is fused to the land and cut.

In the process of manufacturing this type of semiconductor device, it is necessary to inspect the characteristics of each semiconductor chip prior to its mounting, so various characteristic tests are normally performed by means of an IC tester. In the characteristic tests, a probe card provided with a large number of probes is used and the tips of the probes are simultaneously put in contact with the bonding pads of the semiconductor chip, thus achieving the interface for testing.

However, at the time of probe contact in the aforementioned characteristic tests, the bonding pads of the semiconductor chip may be damaged and the aluminum metal on the surface may delaminate in this portion, resulting in the lower layer of titanium tungsten (TiW) or the like being exposed. In the wire bonding method, at the time of this joining, it is preferable for an alloy layer to be formed between the aluminum layer of the bonding pad and the gold or the like constituting the metal wire, in order to increase the strength of bonding. However, the delamination of aluminum due to the aforementioned probe contact decreases the surface area in which said alloy layer is formed, and as a result there is a problem in that the bonding reliability of the metal wire is decreased.

This problem becomes even more grave as the semiconductor chip becomes smaller and as the bonding pad size becomes smaller as performance increases. To wit, as the size of the bonding pad and the compression bonding ball of metal wire become smaller, the fraction damaged due to the aforementioned probe contact becomes extremely large. For example, as the diameter of the compression bonding ball of the metal wire becomes roughly 45 $\mu$m, the fraction containing probe damage exceeds 30%.

Therefore, an object of the present invention is to provide a structure and method in the wire bonding method that gives adequate connection strength between the bonding pads and conductor wire.

A further object of the present invention is to achieve the previous object while also providing a semiconductor device and its method of manufacture wherein the pitch between bonding pads is made smaller to be suitable to finer pitches.

SUMMARY OF THE INVENTION

The semiconductor device according to the present invention comprises: a semiconductor chip upon which are disposed roughly upon a straight line a plurality of bonding pads containing a first region as a connection region and a second region for making contact with a testing probe, and said first and second regions are lined up in a direction perpendicular to said straight line, a member provided with a plurality of conductors containing a third region as a connection region electrically connected to each of a plurality of external connection terminals and a securing area for securing said semiconductor chip, a plurality of conductor wires that electrically connect said first regions of said plurality of bonding pads to said third regions of said plurality of conductors, and an encapsulating member that encapsulates said semiconductor chip and said plurality of conductor wires.

It is preferable that said plurality of bonding pads comprise first bonding pads provided with said first regions toward the edge of said semiconductor chip and second bonding pads provided with said second regions toward the edge of said semiconductor chip, and said first and second bonding pads are disposed alternately roughly upon a straight line.

In addition, it is preferable that said plurality of bonding pads be rectangular in shape with their with their short sides lying in a direction along the edges of said semiconductor chip. Moreover, it is preferable that said plurality of bonding pads be formed with the width of said first region being wider than the width of said second region in the direction along the edges of said semiconductor chip.

Furthermore, it is preferable that said plurality of bonding pads have notches between said first region and said second region.

In addition, it is preferable that said member be an insulating substrate upon one surface of which said semiconductor chip is secured by adhesive, said external connection terminals are roughly spherical terminals formed on the other surface of said substrate, said encapsulating member is resin that encapsulates said semiconductor chip and said plurality of conductor wires on one surface of said substrate, and the lands as said third regions are electrically connected to said roughly spherical terminals via through holes.

The method of manufacturing semiconductor devices according to the present invention comprises: a step wherein a semiconductor chip upon which is disposed roughly upon a straight line a plurality of bonding pads containing a first region as a connection region and a second region for making contact with a testing probe, and said first and second regions are lined up in a direction perpendicular to said straight line, and a member provided with a plurality of conductors containing a third region as a connection region electrically connected to each of a plurality of external connection terminals and a securing area for securing said semiconductor chip are secured, and a step wherein a plurality of conductor wires electrically connect said first regions of said plurality of bonding pads to said third regions of said plurality of conductors.

It is preferable that said plurality of bonding pads comprise first bonding pads provided with said first regions toward the edge of said semiconductor chip and second bonding pads provided with said second regions toward the edge of said semiconductor chip, and said first and second bonding pads are disposed alternately roughly upon a straight line.

In addition, it is preferable that said connection step comprises: a first step wherein said first region of said plurality of first bonding pads are connected by conductor wire to said third regions of said plurality of conductors, and a second step wherein said first region of said plurality of second bonding pads are connected by conductor wire to said third regions of said plurality of conductors.

Moreover, it is preferable that said method further comprises a step wherein, prior to said securing step, testing of said semiconductor chip is performed by putting test probes into contact with the second regions of said plurality of bonding pads.

Figure 1:
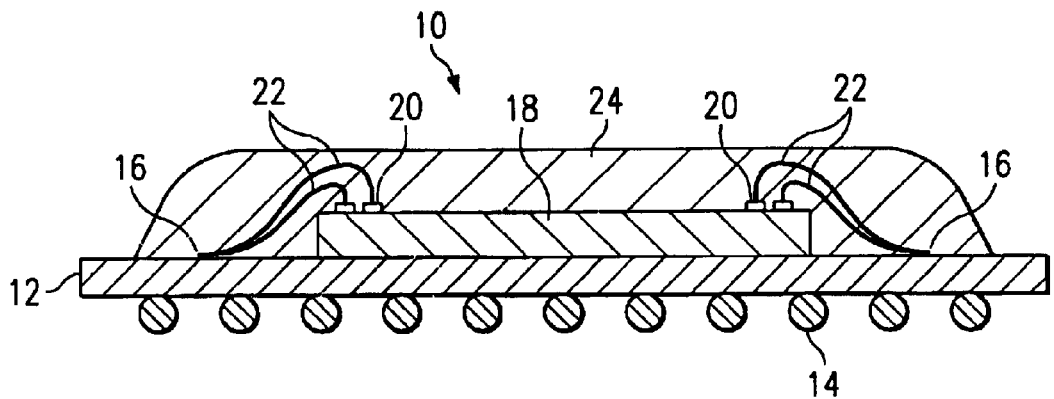
FIG. 1 is a schematic cross section of a semiconductor device according to one embodiment of the present invention.

REFERENCE NUMERALS AND SYMBOLS AS SHOWN IN THE FIGURES 10 semiconductor device
12 insulating substrate
14 solder bumps
16 lands
18 semiconductor chip
20 bonding pads
22 conductor wire
24 molding resin
30 bonding region
32 probe contact region
40 wafer
42 probe card
44 probes
46 IC tester
50 capillary

DESCRIPTION OF THE EMBODIMENTS

Here follows an explanation of embodiments of the present invention made with reference to drawings. FIG. 1 is a schematic cross section of a BGA type semiconductor device which has a conductor wire bonding structure according to the present invention. The semiconductor device 10 consists of a semiconductor chip 18 mounted upon an insulating substrate 12 and encapsulated with molding resin 24. Upon the insulating substrate 12 is formed wiring including lands 16 as the conductor wire connection terminals. Bonding pads 20 upon the lands 16 and semiconductor chip 18 are connected by means of conductor wire 22. The wiring upon the insulating substrate 12 is connected via through holes (not shown) in the insulating substrate 12 to solder bumps 14 which serve as external connection terminals.

Figure 2:
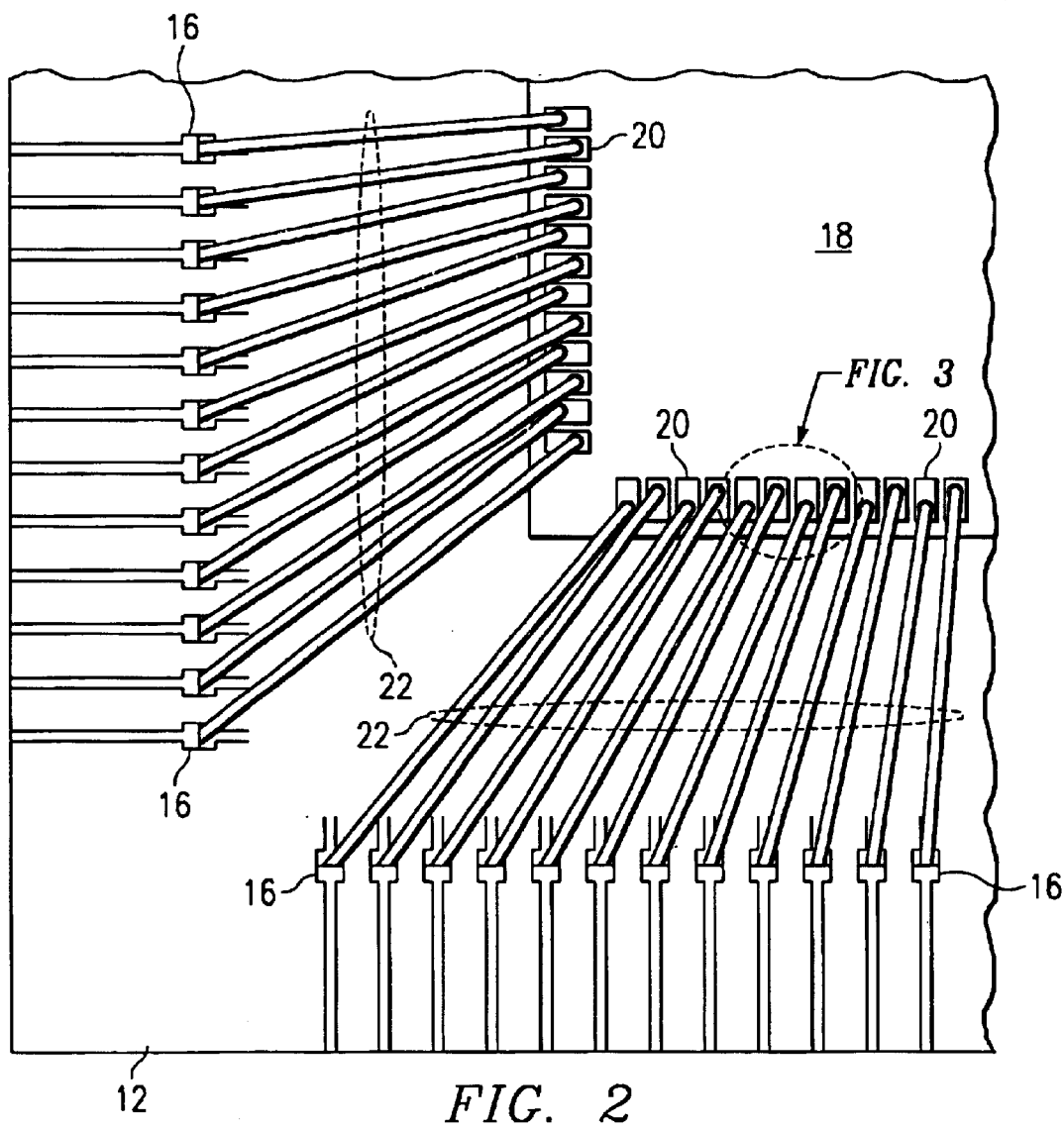
FIG. 2 is a detail view of the semiconductor device shown in FIG. 1.

FIG. 2 is a detail view of the BGA type semiconductor device shown in FIG. 1. Note that in this view, the molding resin 24 is removed. In the figure, the semiconductor chip 18 is mounted upon the insulating substrate 12. Many bonding pads 20 are formed on the primary surface of the semiconductor chip 18 along its edge. The bonding pads 20 are rectangular in shape, with their short sides lying in a direction along the edges of the chip primary surface, and their long sides lying in a direction perpendicular to the edges of the chip primary surface. The starting end of the conductor wire 22 is bonded at a position offset in the lengthwise direction among adjacent bonding pads 20. The details of the bonding structure of the conductor wire with respect to the bonding pads will be described later. In addition, the terminating ends of the conductor wire are bonded to the lands 16 of the insulating substrate 12.

Figure 3:
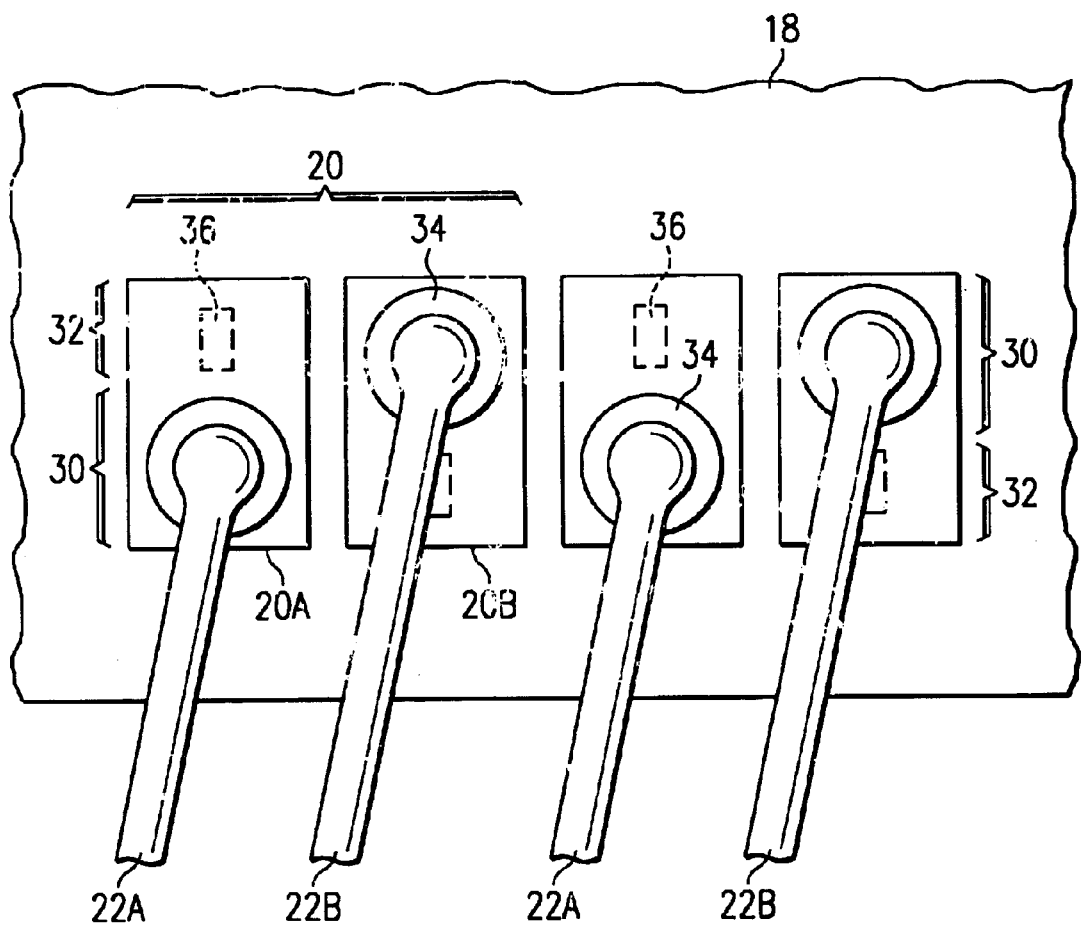
FIG. 3 is an enlarged view of region A of FIG. 2.

FIG. 3 is an enlarged view of region A of FIG. 2. As is evident from the figure, each of the bonding pads 20 has a rectangular shape, and along its lengthwise direction, has a region for the bonding of the conductor wire, namely a bonding region 30, and a region for making contact with a testing probe, namely a probe contact region 32. At the time of formation of the bonding pad, these regions 30 and 32 need not necessarily be clearly distinct physically. The bonding pads 20 need merely be given sufficient breadth in their exposed regions that the region required for bonding, namely the bonding region of the compression bonding ball at the tip of the conductor wire, does not overlap with the contact region for the probe tip. As one example, the length of the contact region for the probe tip may be 30 $\mu$m, and in the case of bonding a compression bonding ball with a diameter of 40 $\mu$m, it is possible to form a bonding pad measuring 55×85 $\mu$m.

As shown in the subsequent steps, the probe contact region 32 is contacted by a testing probe in the wafer stage, and may suffer delamination of the aluminum on the surface of the bonding pad due to this contact, thus exposing the titanium tungsten (TiW). In the figure, the damage due to probe contact is shown by the broken lines 36. According to the present invention, the starting end of the conductor wire 22 is bonded to the bonding region 30 and the bonding region 30 is not affected by the probe contact, so a good alloy layer is formed between the bonding pads 20 and conductor wire 22, ensuring a strong bond.

In FIG. 3, the bonding structure according to this embodiment has a layout such that the orientations of the bonding region 30 and probe contact region 32 alternate in adjacent bonding pads. As a result, as is evident from the figure, the starting ends of the conductor wires bonded to the bonding region 30 of each of the bonding pads are laid out in a staggered pattern. Thus, the same advantages of the so-called staggered layout, in which the adjacent bonding pads are offset toward the inside of the primary surface of the chip, are also obtained with the structure according to the present invention. To wit, with the ordinary bonding pad layout (called the inline layout), when the pitch between bonding pads is made smaller, the capillaries that connect conductor wires would make contact with the conductor wire upon the adjacent bonding pad, but if the staggered layout is adopted, the pitch between the bonding positions of conductor wire for bonding pads becomes larger than the pitch between bonding pads, so even if the same pitch between bonding pads as in the aforementioned inline layout is adopted, contact between the capillary and the conductor wires does not occur. By adopting a layout in which the bonding region alternates between adjacent bonding pads, the advantage of this staggered layout may be obtained even in the inline layout.

In addition, while this is not clear from FIG. 3, as described later, in the semiconductor device 10, the conductor wires 22A bonded to bonding pads 20A with the bonding region 30 oriented toward the edge of the chip have a height different from that of the conductor wires 22B bonded to bonding pads 20B with the bonding region 30 oriented away from the edge of the chip. To wit, as shown in FIG. 1, the crown of the conductor wires 22B is disposed higher than the crown of the conductor wires 22A, thus avoiding contact in the vicinity of the crown area.

Figure 4:
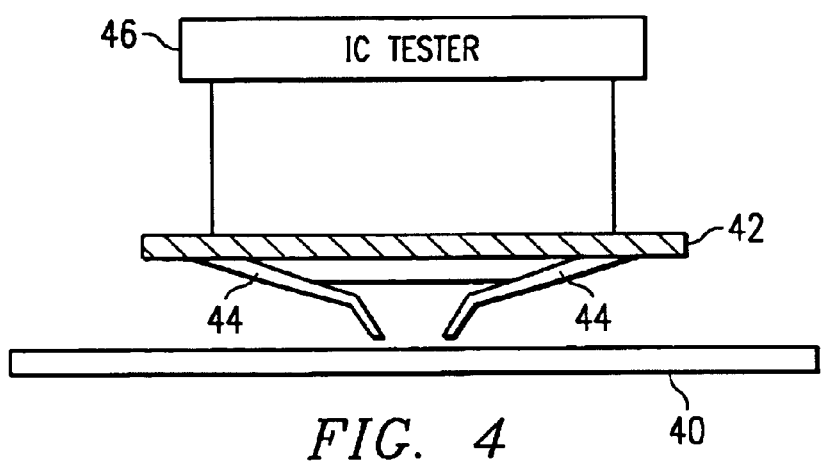
FIG. 4 is a figure showing the wafer inspection process.

Next, FIG. 4 shows the wafer inspection process performed at the time of manufacture of a semiconductor device. The semiconductor chip 18 to be mounted in the semiconductor device 10 undergoes inspection by an IC tester 46 at the wafer 40 stage prior to dicing. In this inspection, a probe card 42 is used in order for the IC tester 46 to interface with the wafer 40 on which the semiconductor chips are formed. The probe card 42 is provided on one side with many probes 44 that contact the bonding pads of the semiconductor chips formed upon the wafer 40. The IC tester 46 measures the electrical characteristics of the semiconductor chips contacted via the probes 44. In the present invention, the semiconductor chips 18 formed upon the wafer 40 are provided with bonding pads that have a probe contact region 32 in addition to the bonding region 30 as described above. In this inspection step, the tips of the probes 44 make contact with the probe contact region 32 of each bonding pad.

As shown in FIG. 3, the orientation of the probe contact region 32 alternates in adjacent bonding pads, so the tips of the probes 44 of the probe card are given a staggered layout in order to match this layout. After passing through the aforementioned inspection step, the wafer 40 is subjected to the marking of semiconductor chips judged to be defective in the inspection step and is diced into individual semiconductor chips, so that only the good chips pass on to the assembly step to be described later.

Figure 5A:
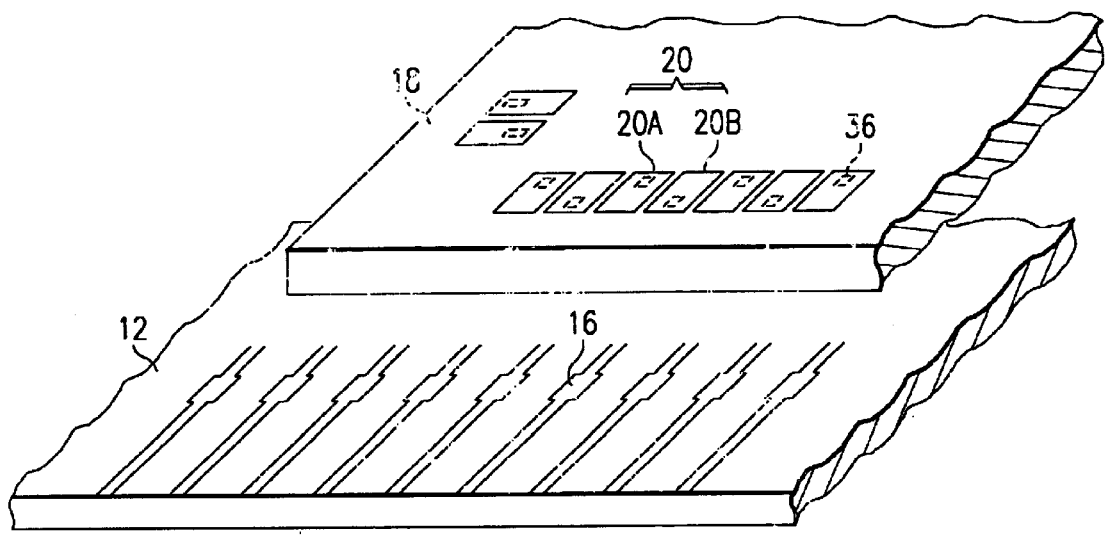
FIG. 5 is a figure illustrating the manufacturing process for the semiconductor device according to one embodiment of the present invention.
Figure 5B:
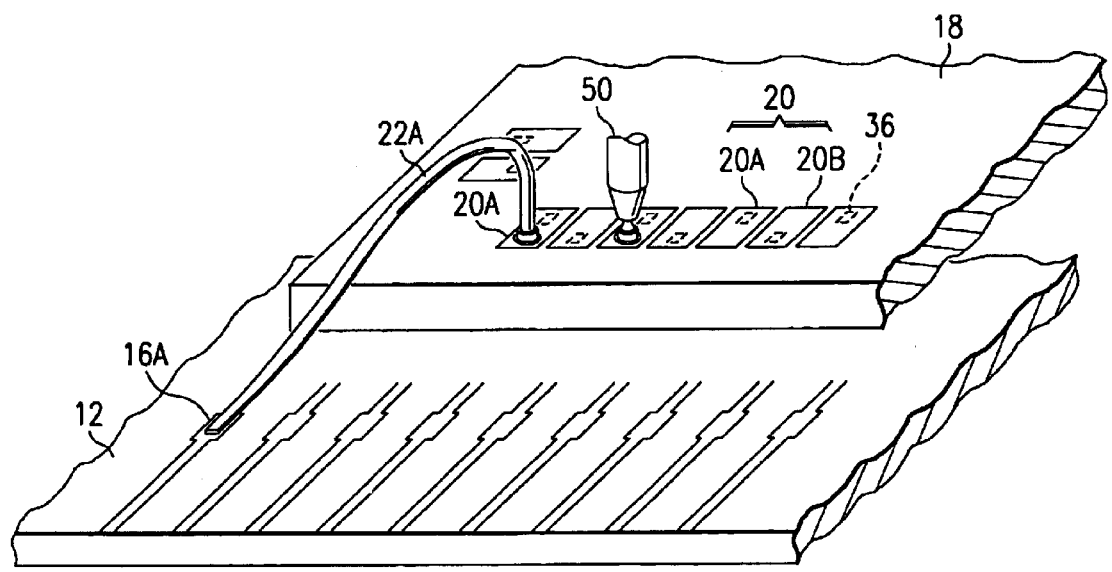
Figure 6A:
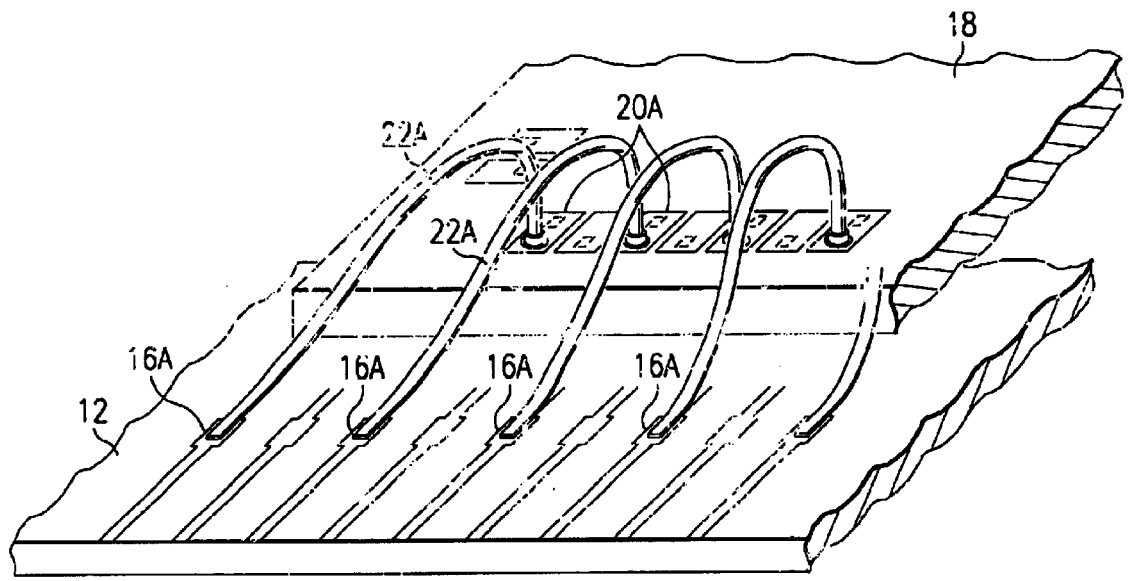
FIG. 6 is a figure illustrating the manufacturing process for the semiconductor device according to one embodiment of the present invention.
Figure 6B:
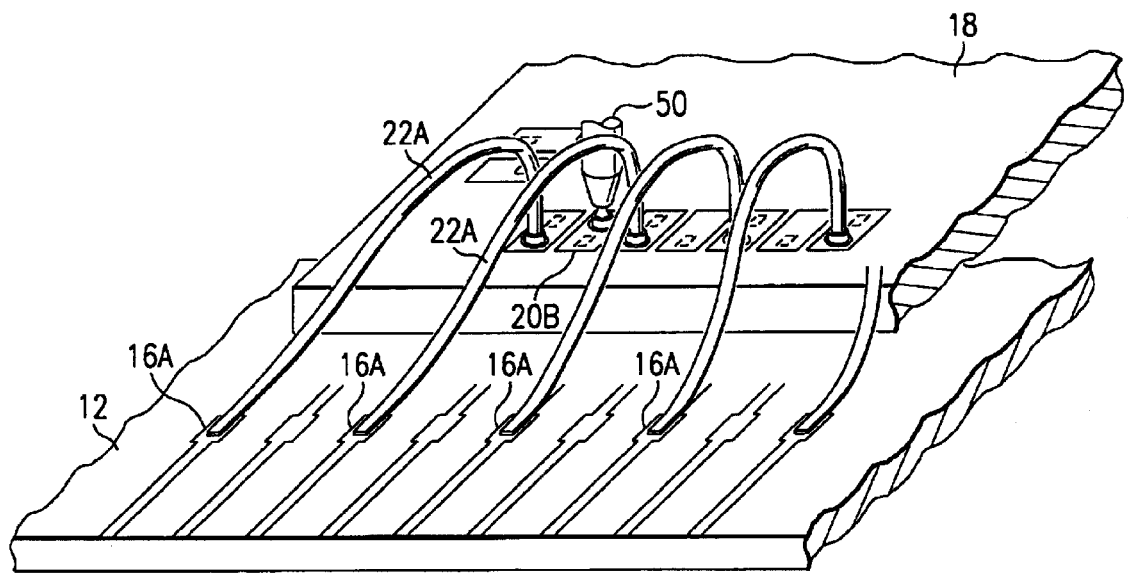
Figure 7:
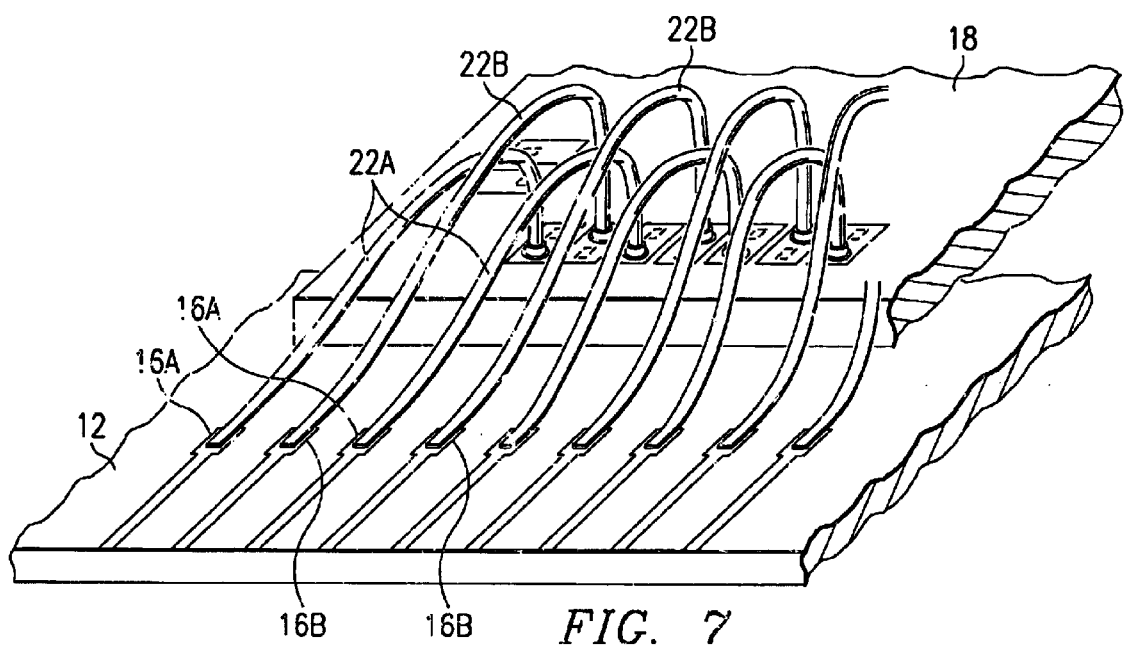
FIG. 7 is a figure illustrating the manufacturing process for the semiconductor device according to one embodiment of the present invention.

FIGS. 5–7 show Steps (A) through (E) which illustrate the assembly process for the semiconductor device mounted with the semiconductor chip having the bonding pad shape according to the present invention. Prior to the assembly of the BGA type semiconductor device, an insulating substrate 12 for semiconductor chip mounting is prepared. This insulating substrate is given copper or other metal wiring including lands 16 on its surface and through holes (not shown) are formed in order to achieve connection between this wiring and the solder bumps. In Step (A), the semiconductor chip 18 is secured to the correct position on the insulating substrate 12 by means of adhesive applied on the rear surface of the semiconductor chip. In a preferred embodiment, the insulating substrate 12 is supplied in the form of a flexible insulating film of polyimide or the like, and a plurality of semiconductor chips is mounted continuously here.

Next, in Step (B), a capillary 50 is used to start the wire bonding. In the first bonding step, bonding pads 20A (hereinafter, the first pads) having the bonding region oriented toward the edge of the semiconductor chip 18 are sequentially wire bonded to the corresponding lands 16A on the insulating substrate 12. Namely, the capillary 50 is lowered upon the bonding region 30 of the first pad, a ball at the tip of the conductor wire 22A is compression bonded, the capillary is quickly raised to a stipulated height, drawing a loop, and then the capillary is moved to the corresponding land 16A. Above the land 16A, the capillary is pressurized and slightly mashes the conductor wire 22A and is then pulled up so that the capillary 50 is separated from the conductor wire 22A. This process is repeated sequentially between the bonding region 30 of the first pads 20A (namely, every other pad) and the corresponding lands 16A, until the first bonding step is complete as shown in Step (C) of FIG. 6.

Next, the bonding step is performed on the remaining bonding pads, namely the bonding pads 20B (hereinafter, the second pads) that have the bonding region 30 on the inside of the bonding pad. In Step (D) of FIG. 6, the wire bonding step is performed sequentially between the bonding region 30 of the second pads and the corresponding lands 16B. To wit, in the same manner as for the first pads, the capillary 50 is lowered upon the bonding region 30 of the second pad, a ball at the tip of the conductor wire 22B is compression bonded, the capillary 50 is quickly raised to a stipulated height, drawing a loop, and then the capillary 50 is moved to the corresponding land 16B. Above the land 16B, the capillary is pressurized and slightly mashes the conductor wire 22B and is then pulled up so that the capillary 50 is separated from the conductor wire 22B. In this step, the height to which the capillary 50 is pulled up above the bonding pad 20B is formed such that its crown is higher than the crown of the conductor wire bonded to the first pads. This is understandable from the appearance of the semiconductor device 10 shown in FIG. 1. By varying the height of the crown of adjacent conductor wires 22, the probability of contact between conductor wires is greatly reduced. At the end of this step, the wire bonding of all bonding pads is complete as shown in Step (E).

Within the aforementioned wire bonding, the insulating film upon which the semiconductor chip is mounted is disposed within a molding mold and by supplying molding resin to said mold, nearly the entire surface of the insulating substrate including the semiconductor chip and conductor wire is covered, and at the same time, the outside of the semiconductor package is formed. Thereafter, solder balls which will become external connection terminals are placed upon the positions of through holes to the rear surface of the insulating substrate and fixed by solder reflow. A punching tool is used to punch the insulating film from the package to obtain the semiconductor device 10 shown in FIG. 1.

Figure 8:
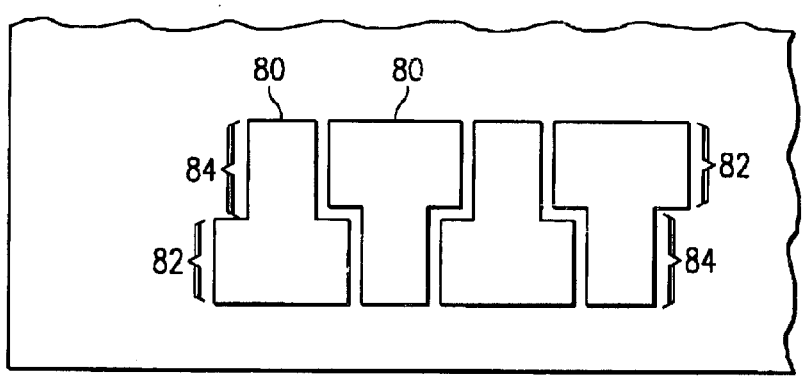
FIG. 8 is a plan view showing another shape of the bonding pads.
Figure 9:
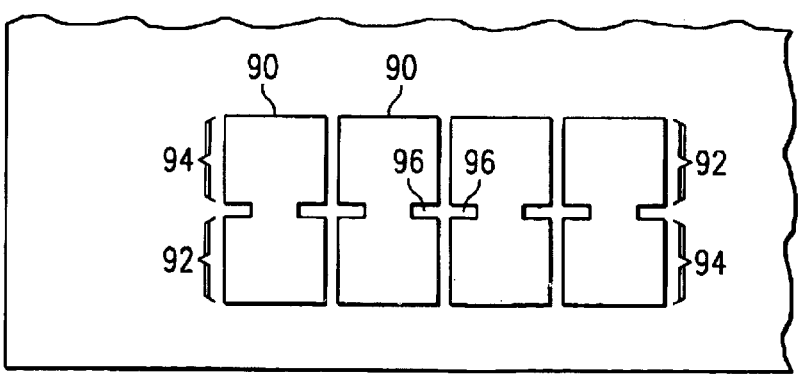
FIG. 9 is a plan view showing another shape of the bonding pads.

FIGS. 8 and 9 illustrate other examples of the constitution of the bonding pads that can be adopted according to the present invention. In FIG. 8, the bonding pads 80 have a bonding region 82 and a probe contact region 84, where the bonding region 82 is formed wider than the probe contact region 84. By making the bonding region 82 relatively wider, it is possible to adopt relatively thick conductor wires. The fact that using thick conductor wires is preferable in reducing deformation of said conductor wires is clear to persons skilled in the art. On the other hand, making the probe contact region 84 relatively narrow has the advantage in that the pitch between bonding pads can be made narrow while still maintaining a broad bonding region 82 in the case that the orientation of the bonding regions 82 of the bonding pads 80 alternates as shown in the figure. There is no problem with using a probe contact region that is narrower than the bonding region as long as a probe with a typical tip shape is used.

In FIG. 9, the bonding pads 90 have a bonding region 92 and a probe contact region 94, along with a notch 96 that serves as an indicator of the boundary position on both sides. The bonding equipment currently in use determines the bonding position upon the semiconductor chip by means of image processing of the primary surface of the semiconductor chip. The aforementioned notch 96 makes the distinction between the bonding pad 90 and bonding region 92 even better in image processing, so bonding can be performed reliably in the region in question.

This completes the description of the embodiments of the present invention made with reference to figures. However, the scope of the present invention is in no way limited to the elements illustrated in the aforementioned embodiments, but rather it should be interpreted based on the claims. The present invention was illustrated in the embodiments using the example of a BGA type semiconductor device. However, the present invention is also applicable to other packages that use lead frames, for example, the Quad Flatpack Package (QFP) or Thin QFP (TQFP). Moreover, it is also applicable to semiconductor devices in ceramic packages.

In addition, the destination to which the terminating end of the conductor wire connects may be other lands depending on the structure of the semiconductor device, and when the present invention is used in the aforementioned QFP, etc., the terminating end of the conductor wire may be bonded to inner leads. In addition, in a semiconductor device containing a plurality of semiconductor chips, the lands may also be the bonding pads of other semiconductor chips.

Moreover, the process of the embodiment illustrated the case in which the bonding to the first pads, namely the bonding pads that have the bonding region on the outside, was first completed and then the bonding to the second pads, namely the bonding pads that have the bounding region on the inside, was performed. However, as long as the present invention is followed, it is also possible to perform bonding of the first pads and second pads alternately starting from the edge of the semiconductor chip. In addition, at the time of working of the present invention, the shape of the bonding pads is not limited to the aforementioned embodiments, but rather they may also be trapezoidal in shape.

Effects of the Invention

By means of the present invention as described above, the region of the bonding pad to which the conductor wire is bonded will not be damaged by the contact of probes in the previous inspection step, and accordingly, the reliability of connection of conductor wires to the bonding pads is not decreased:

In addition, according to the present invention wherein the orientation of bonding regions alternates among adjacent bonding pads, it is possible to make the pitch between bonding positions on adjacent bonding pads greater than the pitch between bonding pads, and accordingly, the pitch between bonding pads can be made smaller in spite of the inline layout of bonding pads.

What is claimed is:

1. A semiconductor device comprising:
   a semiconductor chip upon which are disposed roughly upon a straight line a plurality of bonding pads, each of said bonding pads containing a first region as a connection region and a second region for making contact with a testing probe, and said first and second regions are lined up in a direction substantially perpendicular to said straight line, wherein said plurality of bonding pads comprises a first group of bonding pads with said first regions in a first direction and said second regions in a second direction, and a second group of bonding pads provided with said second regions in said first direction and said first regions in said second direction,
   a member provided with a plurality of conductors containing a third region as a connection region electrically connected to each of a plurality of external connection terminals and a securing area for securing said semiconductor chip,
   a plurality of conductor wires that electrically connect said first regions of said plurality of bonding pads to said third regions of said plurality of conductors, and
   an encapsulating member that encapsulates said semiconductor chip and said plurality of conductor wires.

2. The semiconductor device according to claim 1 wherein said first and second groups of bonding pads are alternately arranged.

3. The semiconductor device according to claim 1 wherein said plurality of bonding pads are rectangular in shape with their short sides lying in a direction along the edges of said semiconductor chip.

4. The semiconductor device according to claim 1 wherein said plurality of bonding pads are formed with the width of said first region being wider than the width of said second region in the direction along the edges of said semiconductor chip.

5. The semiconductor device according to claim 1 wherein said plurality of bonding pads have notches between said first region and said second region.

6. The semiconductor device according to claim 1 wherein said member is an insulating substrate upon one surface of which said semiconductor chip is secured by adhesive, said external connection terminals are roughly spherical terminals formed on the other surface of said substrate, said encapsulating member is resin that encapsulates said semiconductor chip and said plurality of conductor wires on one surface of said substrate, and the lands as said third regions are electrically connected to said roughly spherical terminals via through holes.

7. A method of manufacturing semiconductor devices comprising:
   disposing roughly upon a straight line on a semiconductor chip a plurality of bonding pads containing a first region as a connection region and a second region for making contact with a testing probe, and said first and second regions are lined up in a direction perpendicular to said straight line, wherein said plurality of bonding pads comprises a first group of bonding pads with said first regions in a first direction and said second regions in a second direction, and a second group of bonding pads provided with said second regions in said first direction and said first regions in said second direction,
   providing a member with a plurality of conductors containing a third region as a connection region electrically connected to each of a plurality of external connection terminals, and a securing area for securing said semiconductor chip, and
   disposing a plurality of conductor wires to electrically connect said first regions of said plurality of bonding pads to said third regions of said plurality of conductors.

8. The method of manufacturing semiconductor devices according to claim 7 wherein said first and second groups of bonding pads are alternately arranged.

9. The method of manufacturing semiconductor devices according to claim 8 wherein said connection step comprises: a first step wherein said first region of said plurality of first bonding pads are connected by conductor wire to said third regions of said plurality of conductors, and a second step wherein said first region of said plurality of second bonding pads are connected by conductor wire to said third regions of said plurality of conductors.

10. The method of manufacturing semiconductor devices according to claim 7 further comprising a step wherein, prior to securing said semiconductor chip to said securing area, testing of said semiconductor chip is performed by putting test probes into contact with the second regions of said plurality of bonding pads.

11. The semiconductor device according to claim 2 wherein said plurality of bonding pads are rectangular in shape with their with short sides lying in a direction along the edges of said semiconductor chip.

12. The semiconductor device according to claim 2 wherein said plurality of bonding pads are formed with the width of said first region being wider than the width of said second region in the direction along the edges of said semiconductor chip.

13. The semiconductor device according to claim 2 wherein said plurality of bonding pads have notches between said first region and said second region.

14. The semiconductor device according to claim 2 wherein said member is an insulating substrate upon one surface of which said semiconductor chip is secured by adhesive, said external connection terminals are roughly spherical terminals formed on the other surface of said substrate, said encapsulating member is resin that encapsulates said semiconductor chip and said plurality of conductor wires on one surface of said substrate, and the lands as said third regions are electrically connected to said roughly spherical terminals via through holes.

15. The semiconductor device according to claim 3 wherein said member is an insulating substrate upon one surface of which said semiconductor chip is secured by adhesive, said external connection terminals are roughly spherical terminals formed on the other surface of said substrate, said encapsulating member is resin that encapsulates said semiconductor chip and said plurality of conductor wires on one surface of said substrate, and the lands as said third regions are electrically connected to said roughly spherical terminals via through holes.

16. The semiconductor device according to claim 4 wherein said member is an insulating substrate upon one surface of which said semiconductor chip is secured by adhesive, said external connection terminals are roughly spherical terminals formed on the other surface of said substrate, said encapsulating member is resin that encapsulates said semiconductor chip and said plurality of conductor wires on one surface of said substrate, and the lands as said third regions are electrically connected to said roughly spherical terminals via through holes.

17. The semiconductor device according to claim 5 wherein said member is an insulating substrate upon one surface of which said semiconductor chip is secured by adhesive, said external connection terminals are roughly spherical terminals formed on the other surface of said substrate, said encapsulating member is resin that encapsulates said semiconductor chip and said plurality of conductor wires on one surface of said substrate, and the lands as said third regions are electrically connected to said roughly spherical terminals via through holes.

18. The method of manufacturing semiconductor devices according to claim 8 further comprising a step wherein, prior to securing said semiconductor chip to said securing area, testing of said semiconductor chip is performed by putting test probes into contact with the second regions of said plurality of bonding pads.

19. The method of manufacturing semiconductor devices according to claim 9 further comprising a step wherein, prior to said securing said semiconductor chip to said securing area, testing of said semiconductor chip is performed by putting test probes into contact with the second regions of said plurality of bonding pads.

20. A semiconductor device; comprising:
a plurality of bond pads arranged on a semiconductor chip, each of said bond pads in said plurality comprising a bond region and a probe region, said plurality of bond pads comprising two groups of bond pads, a first group of bond pads arranged with bond regions in a first direction and probe regions in a second direction, and a second group of bond pads arranged with probe regions in said first direction and bond regions in said second direction, wherein said first and second groups are arranged in an alternating manner with each member of said first group adjacent a member of said second groups and with the probe region of each said member of said first prow, adjacent the bond region of said adjacent member of said second proud.

* * * * *